US006865708B2

(12) United States Patent
Wang

(10) Patent No.: US 6,865,708 B2
(45) Date of Patent: Mar. 8, 2005

(54) HYBRID EARLY-TERMINATION METHODS AND OUTPUT SELECTION PROCEDURE FOR ITERATIVE TURBO DECODERS

(76) Inventor: Xiao-An Wang, 312 Alexander Dr., Allentown, PA (US) 18104

( * ) Notice: Subject to any disclaimer, the term of this patent is extended or adjusted under 35 U.S.C. 154(b) by 543 days.

(21) Appl. No.: 09/906,988

(22) Filed: Jul. 17, 2001

(65) Prior Publication Data

US 2002/0026618 A1 Feb. 28, 2002

Related U.S. Application Data

(60) Provisional application No. 60/227,168, filed on Aug. 23, 2000.

(51) Int. Cl.[7] ............................................. H03M 13/00
(52) U.S. Cl. ....................................................... 714/758
(58) Field of Search ................................. 714/752, 755, 714/758, 800

(56) References Cited

U.S. PATENT DOCUMENTS

| | | | | |
|---|---|---|---|---|
| 6,182,261 B1 * | 1/2001 | Haller et al. | ................ | 714/758 |
| 6,292,918 B1 * | 9/2001 | Sindhushayana et al. | ... | 714/755 |
| 6,557,139 B2 * | 4/2003 | Bohnke | ....................... | 714/758 |
| 6,591,390 B1 * | 7/2003 | Yagyu | ......................... | 714/755 |
| 6,675,342 B1 * | 1/2004 | Yagyu | ......................... | 714/755 |

OTHER PUBLICATIONS

Matache et al., Stopping rules for turbo decoders, Aug. 2000, IMO Progress report 42–142, pp. 1–22.*
J. Hagernauer, E. Offer and L. Papke, "Interative Decoding of Binary and Convolutional Codes", IEEE Transactions on Info. Theory, vol. 42, No. 2, pp. 429–445, Mar. 1996.

R.Y. Shao, S. Lin and M.P.C. Fossorier, "Two Simple Stopping Criteria for Turbo Decoding", IEEE Transactions on Comm., vol. 47, No. 8, pp. 1117–1120, Aug. 1999.

A. Shibutani, H. Suda and F. Adashi, "Complexity Reduction of Turbo Decoding", IEEE VTS 50th Vehicular Technology Conference, Amsterdam, The Netherlands, pp. 1570–1574, Sep. 1999.

Using TM5320C6416 Coprocessors: Turbo Coprocessor (TCP) Application Report. p. 9, Texas Instruments, Jun. 2001.

\* cited by examiner

*Primary Examiner*—Shelly A Chase

(57) ABSTRACT

Methods of early-termination and output selection for iterative decoders are disclosed. A hybrid early-termination method combines the output-comparison-based method with the parity-check-based method. The hybrid approach is far more superior in termination reliability in either of the two individual approaches, without their disadvantages. The hybrid termination method effectively and reliably terminates the iterative decoding process, cutting the majority of the computational load while eliminating the degradation in the bit error rate (BER) and frame-error-rate (FER) performance due to incorrectly terminated frames. An output selection procedure chooses the best possible decoded frame among those from all iterations if the iterative decoding process cannot be early-terminated during the decoding of a received frame and if the iterative decoder has reached the maximum number of iterations, thereby eliminating the iteration abnormality that is inherent in the iterative decoding approach, and improving the BER performance of the standard iterative decoders.

16 Claims, 3 Drawing Sheets

HYBRID EARLY-TERMINATION METHODS AND OUTPUT SELECTION PROCEDURE FOR ITERATIVE TURBO DECODERS

CROSS-REFERENCE TO RELATED APPLICATIONS

This application is entitled to the benefit of Provisional Patent Application, Application No. 60/227,168, filed 2000 Aug. 23.

BACKGROUND—FILED OF APPLICATION

This invention relates to iterative decoding of encoded data in communication systems, specifically to reducing the amount of computations of decoding in an effective and reliable manner, and to improving the error rate performance of the decoder.

BACKGROUND—DESCRIPTION OF PRIOR ART

Turbo codes have been shown to have excellent bit error rate (BER) performance even when the data rate runs close to the channel capacity. This has made the turbo codes the most popular choice for error control codes in today's sophisticated communications systems. In particular, turbo codes have been adopted by all standards for third generation (3G) wireless cell phone systems.

FIG. 1 shows a typical turbo encoder. The encoder operates on the input data on a frame basis (Throughout this application, we use binary data for the purpose of simple illustration. Binary data takes only two values, namely, 0 and 1, or, in the convention of communication systems, 1 and −1. The principles in this application, however, expand and apply to other data formats as well). A frame of data $X=(x_0, x_1, \ldots, x_{L-1})$ is the input to the encoder and is encoded by a first decoder 102. The same input X is also scrambled by an interleaver 104, and then encoded by a second encoder 106. A puncturing unit 108 rearranges X, and the outputs $X^{P1}$ and $X^{P2}$ of encoders 102 and 106 into a bit stream that is then punctured to form the output frame $Y=(y_0, y_1, \ldots, y_{M-1})$. The numbers L and M determine the code rate, $r=L/M$, of the turbo code.

The complexity of an optimum decoder for any meaningful turbo code is far beyond the realm of implementation. Practical turbo decoders are all iterative type that is non-optimum but is believed to have the performance close to that of the optimum one. FIG. 2 shows an iterative decoder. The input frame Y is broken into X, $X^{P1}$ and $X^{P2}$ by a splitting unit 202. The iteration decoding then proceeds as follows. An iteration cycle starts with a first decoder 204. The inputs to first decoder 204 are X, $X^{P1}$ and the de-interleaved extrinsic information (to be explained momentarily) $X^{E2}$ from a second decoder 206. At the first iteration, $X^{E2}$ is initialized to zero. The output of first decoder 204 is the extrinsic information $X^{E1}$ that indicates the likelihood of each bit in X to be zero or one. The extrinsic information is also called soft output, since it is a multi-bit value indicating how close the data bit is to zero or one. When first decoder 204 has finished, second decoder 206 starts decoding with inputs being the interleaved version of X, $X^{E1}$, and $X^{P2}$. A full iteration ends when second decoder 206 is done. The output $X^{E2}$ of second decoder 206 will be used by first decoder 204 in the next iteration. Interleavers 208 and 210, and a de-interleaver 212, are to ensure the proper bit alignments.

After certain number N of iterations (typically N=10~20), the decoded frame is either correct, or the number of errors in the frame will not decrease with further iterations in a significant manner. The iteration process thus stops. X, $X^{E1}$ and $X^{E2}$ are combined and a decision is made by a combining/decision unit 214. The output of combining/decision unit 214 is the output of the iterative decoder.

Iterative decoding is not limited to decoding of the turbo codes. Other codes such as product codes and low-density-parity-check codes also call for iterative decoding as a feasible implementation.

Iterative decoding still requires tremendous amount of computations. For example, for data rate of 2 Mbits/s in 3G standard, it takes an iterative decoder about $10^{10}$ basic operations per second with 10 iterations. Such a requirement far exceeds the capability of the general-purpose computer CPUs or digital signal processors (DSP) of today and even of near future. Special circuitry such as application-specific integrated circuits (ASIC) has to be designed to meet the demand on processing capacity.

Even with ASIC implementation, the amount of processing dictates that the power dissipation of the circuit is huge. Turbo decoder alone, when operates at the high data rate, typically consumes more power than the rest of the receiver does in a 3G system. Most applications, especially wireless, are power limited; the device is generally powered by battery. Reduction in the power consumption directly translates to the extended battery life.

Another problem with iterative decoders is iteration abnormality that is inherent in iterative type of decoders. A standard iterative decoder outputs the decoded frame of iteration N, except that when early-termination is used, the output is the decoded frame of the last iteration. Recall that the iterative decoding is non-optimum. While the BER improvement with the number of iterations is expected, it is not guaranteed. In fact, this rule of thumb breaks down when channel condition improves, i.e., the signal-to-noise ratio (SNR) is higher. It has been observed that the BER can actually get worse with more iterations, and for certain number of iterations, the BER gets worse with higher SNR. Such abnormality can be extremely annoying when incorporating turbo codes into communication systems, since efforts to improve the system performance, such as increasing the number of iterations and improving SNR, may meet with adverse result.

The preceding paragraphs illustrate the some noted problems that iterative decoders possess. The rest of this section will discuss known prior arts to attack these problems.

To reduce the amount of computations hence the power dissipation, an early-termination technique has been applied to the iterative decoder. This technique is based on the fact that not all frames need to go through all N iterations. Many frames become correct after first several iterations. For those frames the iteration can be terminated early so that the computation load for the rest of the iterations is saved. Since one can never know with absolute certainty that a decoded frame is correct unless he or she knows what has been transmitted, an indirect method (a correctness indicator) has to be used to indicate the correctness of a frame. Note that additional error is introduced due to the incorrect termination by the indicators.

Depending upon the types of the indicators used, existing early-termination methods fall into the following categories: output comparison, cyclic-redundant-code (CRC) check and SNR threshold on soft output. Output-comparison-based indicators compare certain characteristics of the decoded frames from consecutive iterations. For example, Hagenauer [1] looked at the cross-entropy of the two frames, where the cross entropy is a measure of similarity of two frames. The hard-decision difference (HDD), which is the number of differing bits between two hard-decisioned frames is another indicator [2], and is called hard-decision-aided (HDA) method. The rational of this approach is that if the number of errors in a frame improves with iterations, so will the indicators. If the indicator shows that the two frames from two consecutive iterations do not change much, it would mean that the frame from current iteration is either (a) containing no errors, or (b) still having errors but unlikely to improve with further iterations. In either case it makes sense to stop the iteration process. Thus in the case of the cross-entropy method, if the cross-entropy goes below a threshold, one can conclude that further improvement is unlikely and the frame is correct. In the case of the HDA, if the number of the differing bits is zero, i.e., the two frames after hard-decision are identical, it is likely that the decoder has come to the correct frame.

The performance of the comparison-based method is mixed. It achieves significant savings in computation, hence in power consumption, generally above 70%. BER and frame error rate (FER), however, degrades due to incorrect termination. For very long frames (about several thousands data bits or more), the degradation in BER is generally kept within 50%. The degradation in FER is more evident, typically more than doubled. For short frames (from below one hundred to one thousand data bits), the degradation is worse for both BER and FER. Simulation shows that the BER and FER with early-termination are 5 and 10 times more than the BER and FER without early-termination, respectively.

The CRC-based early-termination method relies upon the CRC bits that are attached to the frame to detect if there are any errors in the frame. If the frame passes the CRC check, then the frame is declared to be correct. Use of CRC for error detection has long been practiced in communication systems. Its use in conjunction with the turbo decoder for early-termination was described in [3].

The savings in computations of the CRC-based method is slightly higher than the output-comparison-based method, since it takes two frames from consecutive iterations for the latter to make a decision, and even the first frame is correct, it has to wait for the second frame to get the comparison result. The BER and FER performances of the CRC method depend upon the number of CRC bits. In general, if the number of CRC bits is c, the additional error rate caused by CRC-based early-termination is proportional to $2^{-c}$. Thus the larger the c, the better the performance.

Practical systems, however, put a limit on the number of CRC bits. For example, one of the 3G standards, UMTS, has c=24 for very large frames. For smaller frames, c is reduced to 16, 12 or 8. Significant degradation has been observed even for c=24. It is also not very economical to add many CRC bits to short frames. For example, UMTS has a frame size as small as 40 bits. It is a fairly high overhead for a 24-bit CRC to be in a 40-bit frame.

SNR-threshold-based strategy is described in [4] and is summarized as follows. For binary data, there is some value E such that the soft output of first decoder 204 or second decoder 206 in FIG. 2 is centered on either +E or −E, corresponding to +1 or −1. At early iterations, there is significant overlap between the two peaks in the distributions of the soft output. At later iterations where the decoded frame is more likely to be correct, the value E increases, the peaks narrow and become well separated. FIG. 3 shows this phenomenon. Since the distribution of the soft output can be approximated by the distribution of binary signaling with Gaussian noise, an estimated SNR from the soft output can be computed. The higher the soft output SNR, the more separated the peaks. The soft output SNR increases with the number of iterations. If the soft output SNR exceeds a preset threshold after certain iterations, the decoded frame is believed to be correct and the iteration process terminates.

The performance of the SNR-threshold strategy depends a lot upon the chosen threshold. If the threshold is too small, the iteration will terminate too early, resulting unacceptable BER/FER. If the threshold is too high, the decoder may take extra iterations to exceed the threshold after the decoded frame becomes correct, and the benefit of early-termination diminishes. Thus choosing the threshold becomes an undesirable trade-off between the BER/FER and power consumption. Moreover, optimum thresholds change with channel conditions, so a fixed threshold may behave poorly in practice.

In summary, existing early-termination methods cause severe degradation in BER/FER performance, increase system overhead, or force a trade-off between BER/FER and power consumption. Some may not work well, or simply not work at all, in certain conditions. To the best knowledge of this applicant, the other problem, iteration abnormality, has not seen any effective solutions.

SUMMARY OF THE INVENTION

The present invention relates to iterative decoding of an encoded frame of data. A hybrid early-termination method performs a correctness test on the decoded frame and terminates the iteration process if the decoded frame is declared correct. In addition, an output selection procedure chooses one of the decoded frames if, during iterative decoding of an encoded frame of data, all of the decoded frames fail the correctness test.

In accordance with embodiments of the present invention, the hybrid early-termination comprises output-comparison and parity-check. A decoded frame of current iteration is compared with the one of the previous iteration for "closeness test". If the frame passes the closeness-test, it is subjected to parity-check, using the parity-check bits (the CRC check bits are a special case of the parity-check bits) in the encoded frame. If the frame passes the parity-check, it is declared to be correct and the iteration process is terminated.

A variation of the above implementation is that a decoded frame is parity-checked first. If it passes the parity-check, it is compared with a (typically, the latest) frame that also passed parity-check in previous iterations for closeness-test. The frame is declared to be correct if it passes both parity-check and closeness-test.

A salient advantage of the hybrid early-termination is its high reliability. Since the iteration process terminates only if the decoded frame passes two independent tests, there is virtually no incorrect termination, thus eliminating the BER/FER degradation that is common in existing early-termination methods. Hybrid early-termination also requires much fewer parity-check bits than the CRC-check-based early-termination does.

In accordance with embodiments of the present invention, the output selection procedure comprises choosing one of decoded frames if all of the decoded frames fail the correctness-test. An "error indicator" is computed for each decoded frame to indicate the number of errors in the decoded frame. At the end of the iteration process, the decoded frame with a best error-indicator is chosen to be the output of the decoder. A best error-indicator is defined to be an error-indicator that meets certain criterion (criteria), such as the one that indicates that the decoded frame has least errors among frames from all iterations.

The iteration abnormality phenomenon results from the fact that a standard iterative decoder always chooses the decoded frame of the last iteration as the decoder output. Study shows that the output selection procedure completely eliminates the iteration abnormality.

OBJECTS AND ADVANTAGES

Accordingly, several objects and advantages of the present invention are:

(a) to provide an early-termination method that accurately determines the correctness of a decoded frame;
(b) to provide an early-termination method that reliably terminates the iteration process without degrading the BER/FER performance;
(c) to provide an early-termination method that has minimum system overhead;
(d) to provide an early-termination method that eliminates the undesirable trade-off between BER/FER and power consumption;
(e) to provide an output selection procedure that eliminates the iteration abnormality that is inherent in the iterative decoders;
(f) to provide an output selection procedure that improves the BER of the iterative decoder.

Further objects and advantages will become apparent from a consideration of the ensuing description and drawings.

DETAILED DESCRIPTION

Figure 1:
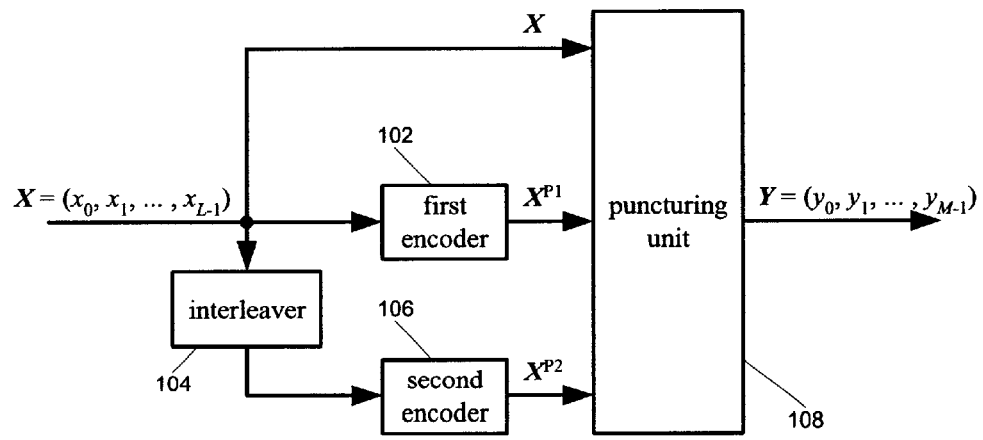
FIG. 1 shows a typical turbo encoder.
Figure 2:
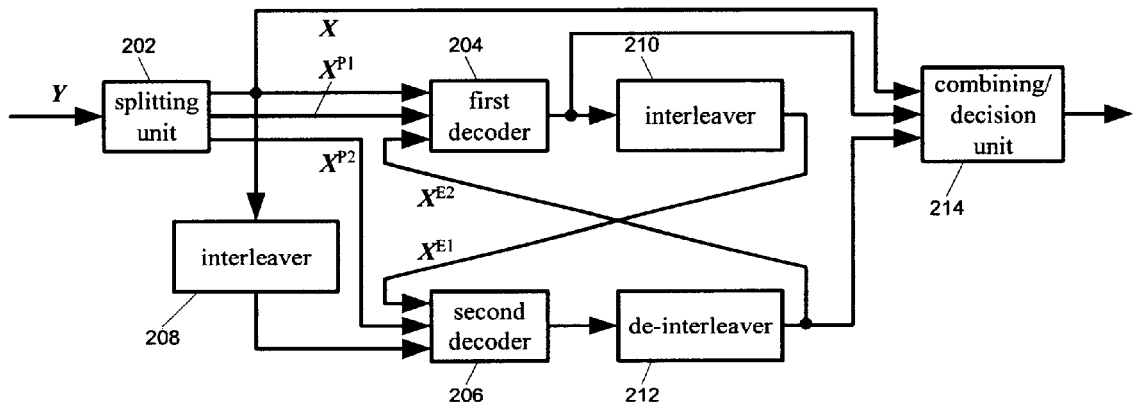
FIG. 2 shows an iterative turbo decoder.
Figure 3:
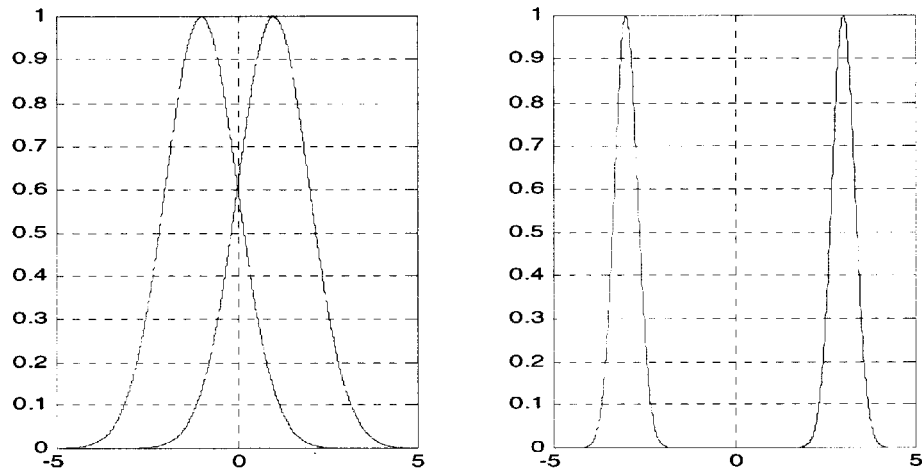
FIG. 3 shows the separation of the peaks in the distribution of the soft output.

The present application combines the output-comparison-based method and the CRC-based method to form a hybrid early-termination method that is extremely reliable and effective. In the comparison process, the present application compares the decoded frames between half iterations to further reduce the computational load. Referring to FIG. 2, one half iteration is defined to be a complete decoding operation by either first decoder 204 or second decoder 206. The present application also uses error-detection codes (EDC) to provide a more general framework that includes CRC as a special case. Best error-detection codes can often be found outside the class of CRC codes, especially when the code length (frame size) is small.

In accordance with embodiments of the present invention, an iterative decoder decodes an encoded frame that includes parity-check information, and terminates the iteration when either (a) the maximum number of iterations N has been reached, or (b) the decoded frames from the current iteration and the previous 0.5M iteration is sufficiently close by some "closeness measure" CM, and the current decoded frame passes the parity-check. The parameter M controls the separation in terms of half iterations between the two decoded frames in comparison. M satisfies $1 \leq M \leq 2N$ and M=1 is the best choice.

In the case that the maximum number of iterations N has been reached, the iterative decoder computes an error-indicator EI for each decoded frame, and selects the frame with the lowest indicator as the decoder output.

The closeness-measure CM defines how close the two decoded frames are. An example of CM for two frames F1 and F2 is $CM_{HD}$, based on the hard-decisioned frames and defined as $CM_{HD}$=hard-decision difference (HDD) between frame F1 and frame F2.

As defined previously, the HDD between frame F1 and frame F2 is the number of differing bits between two hard-decisioned frames F1 and F2.

If F1 and F2 contain soft symbols, i.e., numbers that represent the likelihood value of the bits, a hard decision that converts the likelihood value to bit must be performed first before computing $CM_{HD}$. Two frames are considered to be sufficiently close if $CM_{HD} \leq T_{HD}$, a threshold. An appropriate choice is $T_{HD}=0$.

Another example of CM is cross-entropy based $CM_{CE}$, defined as $CM_{CE}$=the cross-entropy between frame F1 and frame F2.

Approximate expressions for $CM_{CE}$ are derived in [1] and [2]. Two frames are considered sufficiently close if $CM_{CE} \leq T_{CE}$, a cross-entropy threshold. $T_{CE}$ is generally determined by simulations.

Error-indicator EI is chosen to have strong correlations with the number of errors in the frame. It turns out from the simulation study that the following two choices, $EI_{HD}=CM_{HD}$ and $EI_{CE}=CM_{CE}$, yield extremely good results.

Figure 4:
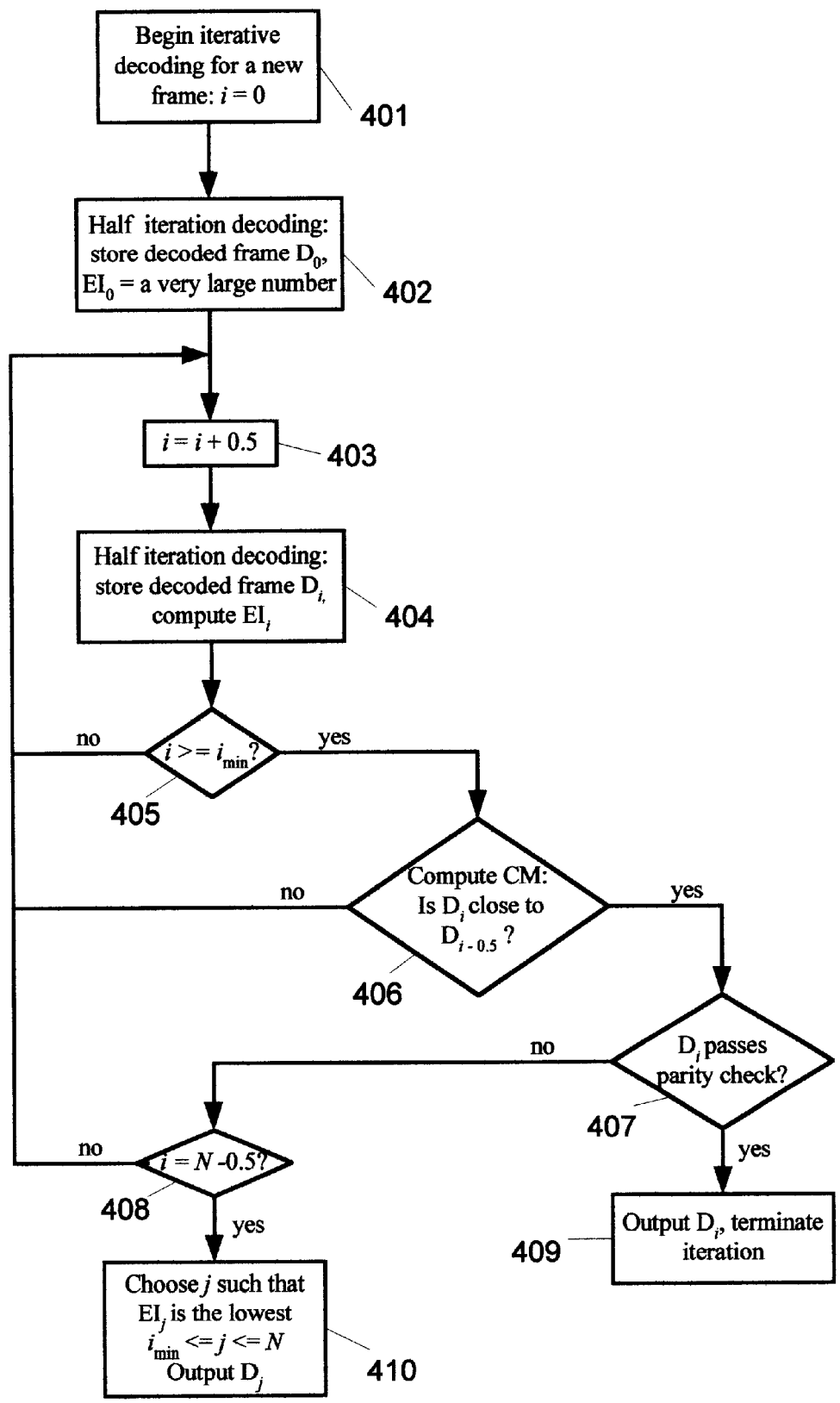
FIG. 4 shows an exemplary implementation of the hybrid early-termination and output selection.

FIG. 4 shows an exemplary implementation in accordance with an embodiment of the present invention, with M=1. Referring to FIG. 4, the decoding of a new frame begins at step 401. At step 401, the iteration counter i is set to zero. At step 402, the first half iteration decoding is performed, and a decoded frame $D_0$ is stored. For the first half iteration, an error-indicator $EI_0$ is set to a very large number. This assumes that the error indicator is positively correlated with the number of errors in the frame; however, an error-indicator that has negative correlation with the number of errors in the frame can also be used, although the choice does not appear to be as natural. In this case, error-indicator $EI_0$ should be set to a very small number (or a negative number with a very large amplitude). Error-indicators with positive correlation are assumed in the rest of the description.

The value that error-indicator $EI_0$ is set to depends upon the implementation. For example, if $EI_{HD}$ is used, $EI_0$ can be set to the size of the frame, since this is the maximum value $EI_{HD}$ can have. If $EI_{CE}$ is used, $EI_0$ can be set to the maximum value that the implemented system can represent.

Step 403 increments the iteration count i by 0.5 when M=1. Step 404 continues to perform the half iteration decoding, store decoded frame $D_i$ and compute error-indicator $EI_i$. At step 405, a test compares whether i is greater than or equal to a prescribed value, $i_{min}$. $i_{min}$ controls at which iteration that early-termination mechanism starts to apply to iterative decoding, and is typically set to 0, in which case step 405 is not necessary. However there are some cases where it is believed the frame is unlikely to be correct in the first several iterations, thus there is no need for testing for early-termination until after $i_{min}$ iterations. Storage of decoded frame $D_i$ and error-indicator $EI_i$ may not be necessary in step 404 before $i_{min}$ iterations. If $i_{min}$ iterations have not been reached, the method proceeds to step 403.

If the test of step 405 determines that $i_{min}$ iterations have been reached, the method proceeds to step 406. Step 406 computes closeness-measure CM to compare if decoded frames $D_i$ and $D_{i-0.5}$ are sufficiently close. Step 406 differs from existing arts such as the ones described in [1] and [2] in that the separation of the two frames can be as small as half iteration in the present invention while existing arts all use frames one full iteration apart. The computational load is further reduced to the minimum by the present invention. If the test of step 406 determines that $D_i$ and $D_{i-0.5}$ do not pass the closeness-test, the method proceeds to step 403.

If it is determined during step 406 that decoded frames $D_i$ and $D_{i-0.5}$ are sufficiently close, the method proceeds to step 407. Step 407 checks the parity of decoded frame $D_i$. If the test of 407 determines that decoded frame $D_i$ passes the parity-check, the method proceeds to step 409. Step 409 outputs decoded frame $D_i$ and terminates the iteration process. The method proceeds to step 401 to start decoding of the next frame.

If, however, the test of step 407 determines that decoded frame $D_i$ does not pass the parity-check, the method proceeds to step 408. Step 408 monitors if the maximum number of iterations, N, has been reached. If the test of step 408 determines that N iterations have not been reached, the method proceeds to step 403.

If, however, it is determined that N iterations have been reached, the method proceeds to step 410. Step 410 chooses an index j such that error-indicator $EI_j$ is the smallest one among all error-indicators $EI_1$, $i_{min} \leq i \leq N$, and selects decoded frame $D_j$ as the output of the iterative decoder. The iterative decoding ends at the completion of step 410. The method proceeds to step 401 to start decoding of the next frame.

Figure 5:
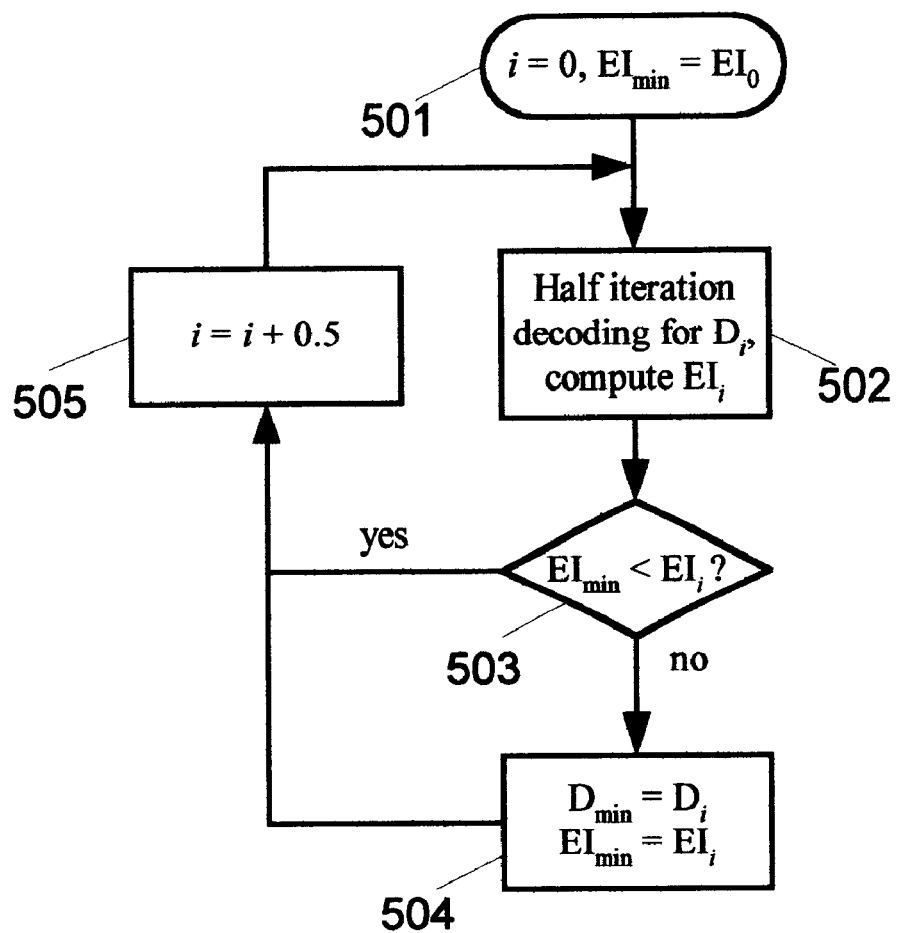
FIG. 5 shows an exemplary implementation of storing decoded frames in output selection.

It appears that all decoded frames have to be stored in order to find the one with smallest EI. FIG. 5 shows an exemplary implementation that requires the storage of only one previously decoded frame. Step 501 initializes an error-indicator buffer $EI_{min}$ to $EI_0$ and iteration counter i to zero. Step 502 performs half iteration decoding and computes error-indicator $EI_i$. Step 503 compares $EI_{min}$ to $EI_i$. If the comparison of step 503 determines that $EI_{min}$ is less than $EI_i$, the program control proceeds to step 505.

If it is determined during step 503 that $EI_{min}$ is not less than $EI_i$, the program control proceeds to step 504. Step 504 updates error-indicator buffer $EI_{min}$ and a decoded frame buffer $D_{min}$ with $EI_i$ and $D_i$. The program control then proceeds to step 505.

Step 505 increments the iteration counter i by 0.5 when M=1. The program control proceeds to step 502. At the end of the iteration process, decoded frame buffer $D_{min}$ is the decoder output with the smallest EI.

Step 503 shows that the buffer updates take place even if $EI_{min}=EI_i$. This guarantees that if there are multiple frames with the same best error-indicator value, the output selection procedure always selects the frame in the latest iteration, since a frame generally has fewer errors in a later iteration.

There are possible variations from the foregoing implementation. To show one exemplary variation, recited below are two conditions for terminating the iteration process mentioned in the second paragraph of this section: (a) the maximum number of iterations N has been reached, or (b) the decoded frames from the current half iteration and the previous 0.5M iteration is sufficiently close by some "closeness measure" CM, and the current decoded frame passes the parity check.

Implementation of condition (b) performs the closeness-test first and then the parity-check. Condition (b) can be replaced by the following: (b') the current decoded frame passes the parity check, and is sufficiently close to, by some "closeness measure" CM, the last previously decoded frame that also passed the parity check.

Implementation of condition (b') performs the parity-check first and then the closeness-test. It may require an additional frame buffer to store the last previously decoded frame that also passed the parity-check. The advantage of using condition (b') is that the BER/FER degradation can be further reduced.

There are also implementation variations in the output selection procedure. For example, computing error-indicator EI involves two decoded frames. One of the decoded frames is the one for which error-indicator EI is computed. When error-indicator EI for a decoded frame is computed, either the preceding decoded frame or next decoded frame can be used as the other decoded frame.

The output procedure can be also made more elaborate. For example, when a frame with the best error-indicator EI is determined, a separate correctness-test, such as parity-check, can be performed on that frame and the other frame that is involved in the calculation of the best error-indicator EI. If one of them passes the test, it will be selected as the output frame.

It is to be understood that the descriptions and variations shown and presented herein are merely illustrative of the principles of this application and that various modifications may be implemented by those skilled in the art without departing from the scope and the spirit of the application.

It is to be further understood that the principles of this application also apply to decoding of error control codes other than turbo codes, such as product codes, low density parity check codes, etc., the decoding of which calls for iterative types of decoder.

I claim:

1. A method for terminating an iterative decoding process in an iterative decoder, comprising the steps of:
   (a) decoding, during a current iteration of said iterative decoding process, an encoded frame, to provide a decoded frame including decoded data and parity information;
   (b) computing a closeness-measure based on said decoded frame and a previously decoded frame from a previous iteration;
   (c) conducting a closeness-test on said closeness-measure;
   (d) conducting a parity-check on said decoded frame if said decoded frame passes said closeness-test;
   (e) terminating said iterative decoding process if said decoded frame passes said parity-check.

2. The method according to claim 1, wherein a means is arranged to conduct said closeness-test in every half iteration, and to conduct said parity-check if said closeness-test is passed.

3. The method according to claim 1, wherein said closeness-measure is cross-entropy.

4. The method according to claim 1, wherein said closeness-measure is hard-decision difference.

5. The method according to claim 1, wherein said previous iteration is half iteration before said current iteration.

6. The method according to claim 1, wherein said parity-check comprises an error-detection code.

7. A method for terminating an iterative decoding process in an iterative decoder, comprising the steps of:

(a) decoding, during a current iteration of said iterative decoding process, an encoded frame, to provide a decoded frame including decoded data and parity information;

(b) conducting a parity-check on said decoded frame;

(c) if said decoded frame passes said parity-check,
  (i) computing a closeness-measure based on said decoded frame and a frame that was decoded and passed said parity-check in a previous iteration;
  (ii) conducting a closeness-test on said closeness-measure;

(d) terminating said iterative decoding process if said decoded frame passes said closeness-test.

8. The method according to claim 7, wherein a means is arranged to conduct said parity-check in every half iteration, and to conduct said closeness-test if said parity-check is passed.

9. The method according to claim 7, wherein said closeness measure is cross-entropy.

10. The method according to claim 7, wherein said closeness measure is hard-decision difference.

11. The method according to claim 7, wherein said previous iteration is the latest iteration, at which said parity-check is passed, from said current iteration.

12. The method according to claim 7, wherein said parity-check comprises an error-detection code.

13. A method for determining an output frame among a plurality of decoded frames of all iterations in an iterative decoder, if said iterative decoder has not been early-terminated and has reached a predetermined maximum number of iterations, comprising the steps of:

(a) computing an error-indicator for each of said decoded frames;

(b) selecting a decoded frame with a best error-indicator to be said output frame.

14. The method according to claim 13, wherein said output frame is from the latest iteration having the same value of said best error-indicator if there are a plurality of the iterations that produce the decoded frames having the same value of said best error-indicator.

15. The method according to claim 13, wherein said error-indicator is cross-entropy.

16. The method according to claim 13, wherein said error-indicator is hard-decision difference.

* * * * *